US009447977B2

(12) United States Patent
Gillespie

(10) Patent No.: US 9,447,977 B2
(45) Date of Patent: Sep. 20, 2016

(54) APPLIANCE AND A METHOD FOR OPERATING AN APPLIANCE

(71) Applicant: General Electric Company, Schenectady, NY (US)

(72) Inventor: Timothy Andrew Gillespie, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 275 days.

(21) Appl. No.: 14/270,649

(22) Filed: May 6, 2014

(65) Prior Publication Data

US 2015/0323193 A1  Nov. 12, 2015

(51) Int. Cl.
*F24C 15/00* (2006.01)
*F24C 7/08* (2006.01)
*G01R 33/09* (2006.01)

(52) U.S. Cl.
CPC ............... *F24C 7/08* (2013.01); *F24C 15/006* (2013.01); *G01R 33/09* (2013.01)

(58) Field of Classification Search
CPC .................................................... F24C 15/006
USPC ......................................................... 126/198
See application file for complete search history.

(56) References Cited

U.S. PATENT DOCUMENTS

| 3,135,905 | A | * | 6/1964 | Malcho | H02P 5/526 318/74 |
| 4,513,233 | A | * | 4/1985 | Giammarrusco | G01P 13/0046 236/89 |
| 4,664,923 | A | * | 5/1987 | Wagner | A21B 2/00 426/233 |
| 5,253,564 | A | * | 10/1993 | Rosenbrock | A21B 1/40 99/326 |
| 5,982,177 | A | * | 11/1999 | Cadieu | G01R 33/09 324/235 |
| 6,772,752 | B1 | * | 8/2004 | Boyer | F24C 7/082 126/21 A |
| 2013/0174746 | A1 | | 7/2013 | Bach | |

FOREIGN PATENT DOCUMENTS

JP     H03239913     10/1991

* cited by examiner

*Primary Examiner* — Avinash Savani
(74) *Attorney, Agent, or Firm* — Dority & Manning, P.A.

(57) ABSTRACT

An appliance is provided. The appliance includes a cabinet that defines an air passage. An air handler has an impeller that is positioned proximate the air passage. The appliance also includes features for determining whether the impeller is rotating. When the impeller rotates, the impeller draws a flow of air through the air passage.

11 Claims, 5 Drawing Sheets

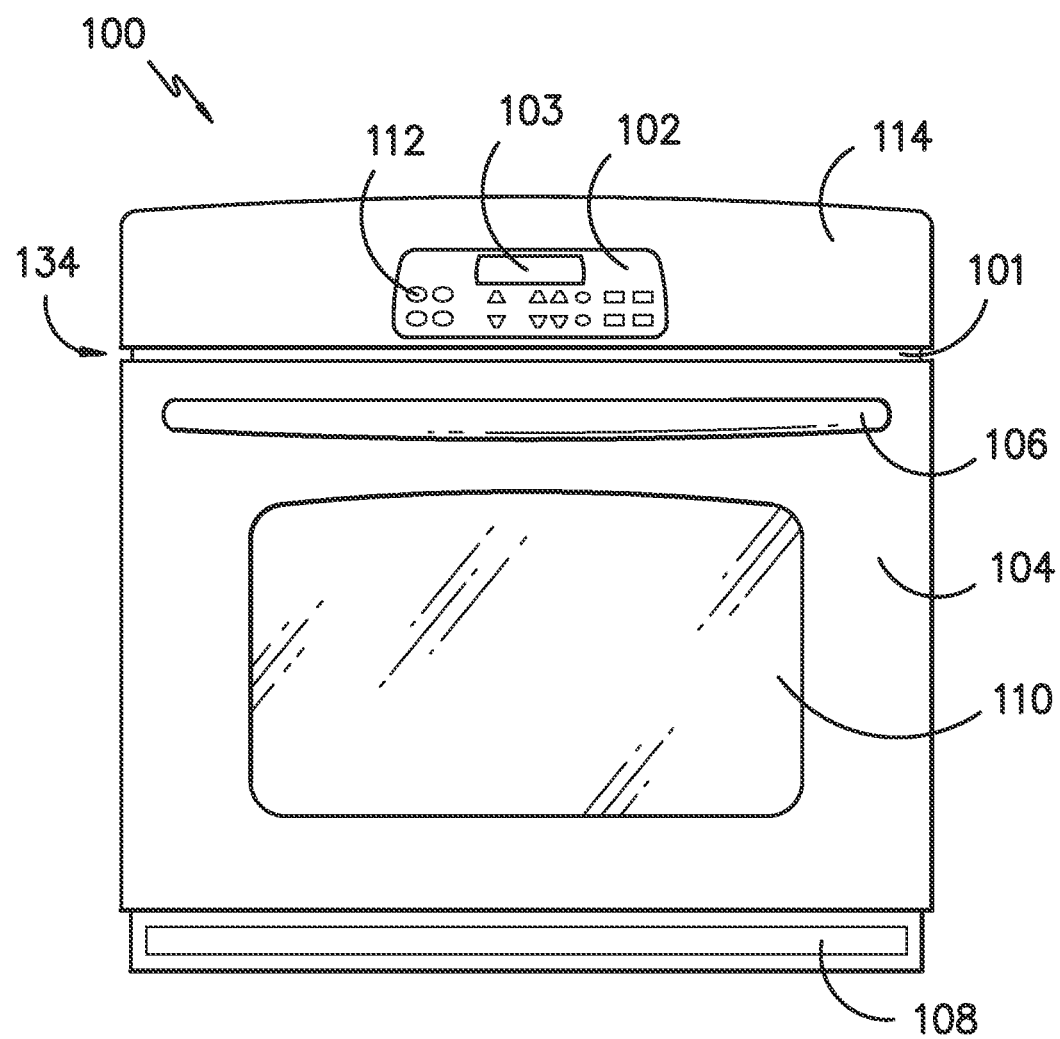
FIG. -1-

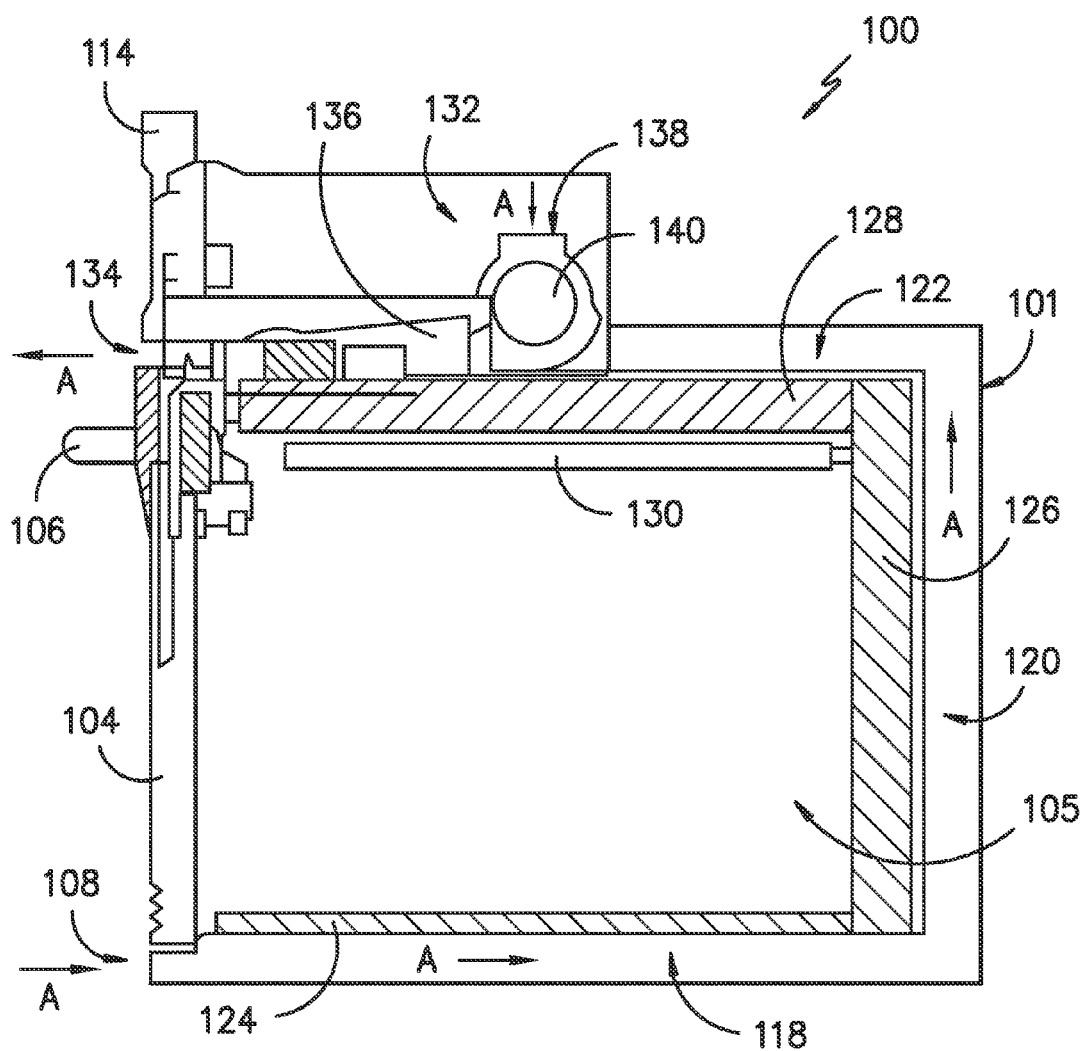
FIG. -2-

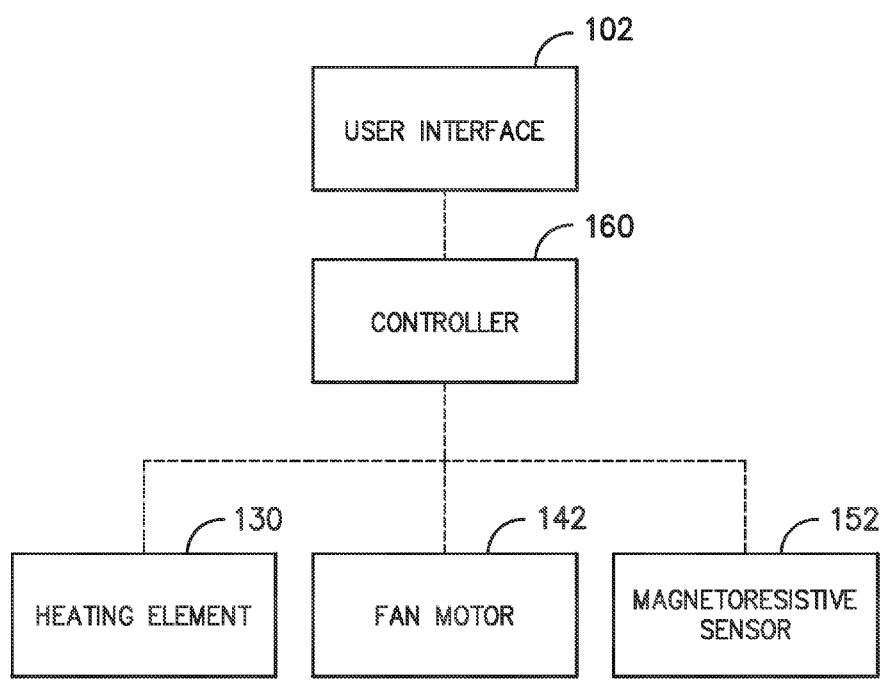
FIG. -3-

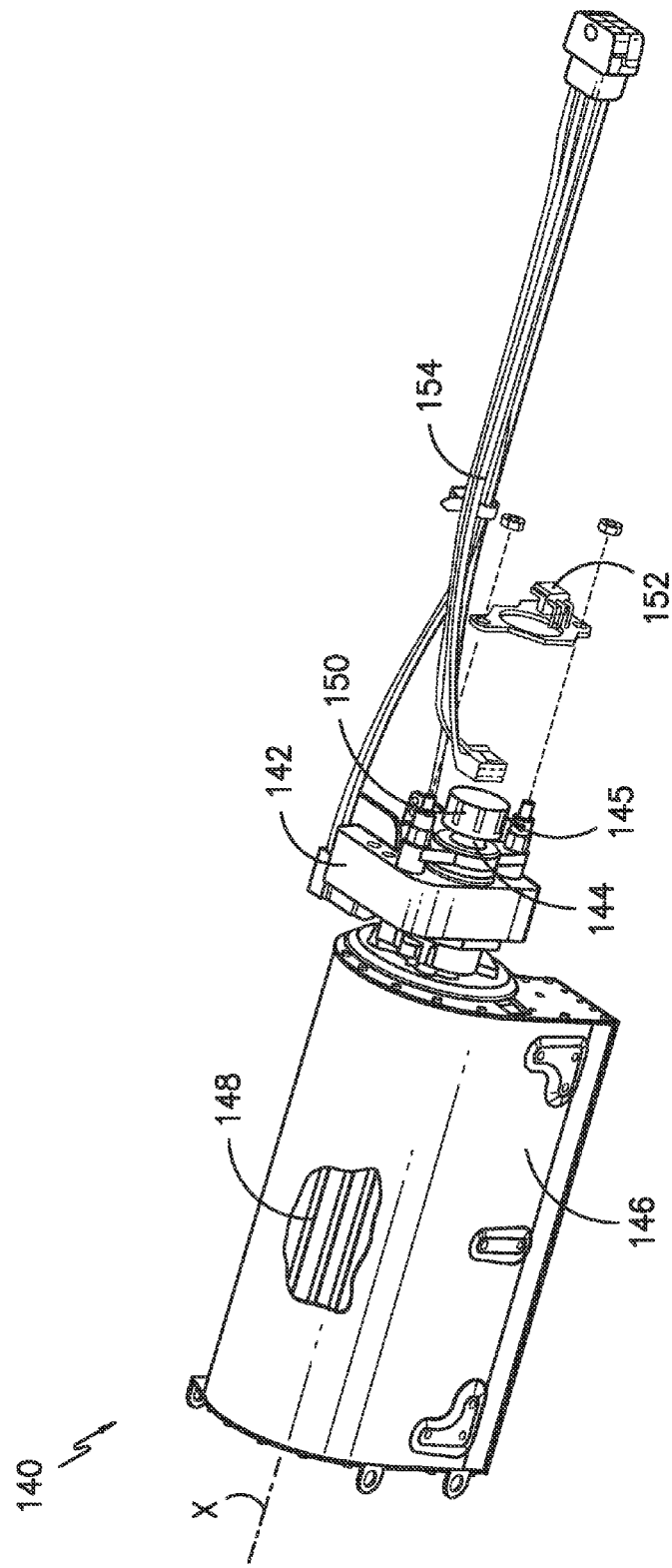
FIG. -4-

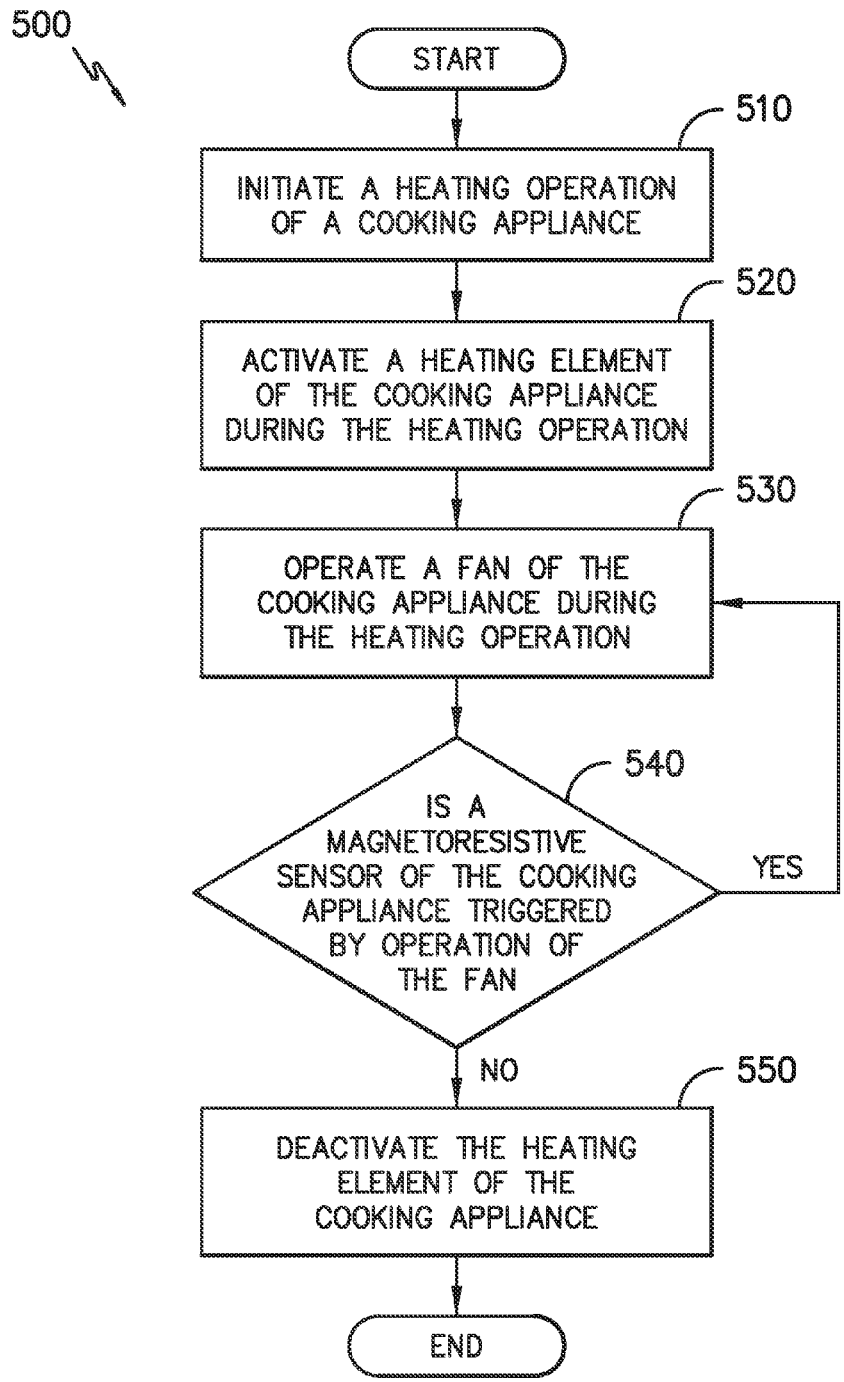
FIG. -5-

APPLIANCE AND A METHOD FOR OPERATING AN APPLIANCE

FIELD OF THE INVENTION

The subject matter of the present disclosure relates generally to appliances, such as oven appliance. More particularly, the present subject matter relates to detection of air flow within a pathway of an appliance.

BACKGROUND OF THE INVENTION

Operation of an oven appliance necessarily generates heat. One or more gas and/or electric heating elements located in a cooking chamber of the oven appliance provide heat not only for cooking but also for cleaning operations. Certain oven appliances have a cleaning cycle where temperatures in the oven appliance exceed 800° F. While oven appliances come in a variety of configurations, including stand-alone or free-standing arrangements, oven appliances are generally designed for placement within cabinetry or some other enclosure within a kitchen space. Frequently, such cabinetry or other enclosure is constructed from wood or a wood-based product. Proper cooling of the oven appliance can assist with reducing or limiting exterior temperatures of the oven appliance near the cabinetry or other enclosure.

Oven appliances are frequently provided with one or more cavities or ventilation ducts positioned outside of the cooking chamber and typically within the cabinet of the appliance. The ducts are used to direct a flow of air through the oven appliance so as to cool the oven appliance, particularly during high temperature operations, such as self-cleaning. Such ducts may be provided in a variety of configurations on one or more sides of the appliance including the top and bottom.

Certain oven appliances rely upon convection to provide movement of air through the ducts. The size of such air ducts can be increased where higher temperatures are expected. However, the space provided for the air ducts typically comes at the expense of space within the cooking chamber. For example, the overall size of oven appliances is generally standardized due to cabinetry sizes and other restrictions. Increasing the cross-section or volume of the ducts necessarily decreases the size of the cooking chamber. As a result, certain oven appliances are provided with a fan or blower to provide a forced air flow through the ducts or ventilation system of the appliance. Such forced air flow improves the cooling ability of the oven appliance and can allow for a reduction in the size of the ducts, vents, and the like that would otherwise be necessary if only natural convection were relied upon for cooling.

Accordingly, an oven appliance having a fan that provides for cooling during cooking or cleaning operations would be useful. In addition, an appliance that also includes features for determining whether a fan of the appliance is properly functioning would also be beneficial.

BRIEF DESCRIPTION OF THE INVENTION

The present subject matter provides an appliance. The appliance includes a cabinet that defines an air passage. An air handler has an impeller that is positioned proximate the air passage. The appliance also includes features for determining whether the impeller is rotating. When the impeller rotates, the impeller draws a flow of air through the air passage. Additional aspects and advantages of the invention will be set forth in part in the following description, or may be apparent from the description, or may be learned through practice of the invention.

In a first exemplary embodiment, an appliance is provided. The appliance includes a cabinet that defines an air passage. The air passage is configured for directing air through at least part of the cabinet. An air handler is positioned proximate the air passage. The air handler includes a motor, a shaft and an impeller. The impeller is coupled to the shaft. The shaft is selectively rotatable with the motor such that the impeller selectively urges a flow of air through the air passage. A magnet is mounted to the shaft of the air handler. A magnetoresistive sensor is positioned adjacent the magnet.

In a second exemplary embodiment, a method for operating an appliance is provided. The method includes initiating a heating operation of the appliance, activating an air handler of the appliance during the heating operation in order to draw a flow of air through an air passage of the appliance, receiving an output of a magnetoresistive sensor of the appliance during the step of activating, and establishing whether the air handler is operating or not operating based at least in part on the output of the magnetoresistive sensor during the step of receiving.

In a third exemplary embodiment, an appliance is provided. The appliance includes a cabinet that defines an air passage. The air passage is configured for circulating air therethrough. An air handler includes an impeller positioned proximate the air passage. The appliance also includes means for determining whether the impeller is rotating.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

FIG. 1 provides a front view of an oven appliance according to an exemplary embodiment of the present subject matter.

FIG. 2 provides a cross-sectional view of the exemplary oven appliance of FIG. 1.

FIG. 3 provides a schematic view of certain components of the exemplary of appliance of FIG. 1.

FIG. 4 provides a perspective view of the air handler of the exemplary of appliance of FIG. 1.

FIG. 5 illustrates a method for operating an oven appliance according to an exemplary embodiment of the present subject matter.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents. Similarly, although chassis cooling of an oven appliance is illustrated, the present subject matter may also be applied to other appliances, such as, but not limited to, a clothes dryer appliance (exhaust air flow detection), a refrigerator appliance (internal cooling air flow detection), a microwave oven appliance (chassis cooling and cavity air flow detection), a window air conditioner appliance, a room air purifier appliance, a dehumidifier appliance, or a computer server tower appliance (internal cooling air flow detection).

Referring to FIGS. 1, 2 and 3, an oven appliance 100 according to an exemplary embodiment of the present subject matter is shown. FIG. 1 provides a front view of oven appliance 100 while FIG. 2 provides a cross-sectional view and FIG. 3 provides a schematic view of certain components of oven appliance 100. As may be seen in FIGS. 1 and 2, oven appliance 100 includes a cabinet 101. A door 104 with handle 106 is mounted to cabinet 101 and provides for opening and closing access to a cooking chamber 105 defined by cabinet 101. A user of oven appliance 100 can place a variety of different items to be cooked in cooking chamber 105. A heating element 130 at the top of cooking chamber 105 provides a heat source for cooking. Heating element 130 can be gas, electric, microwave, or a combination thereof. Other heating elements could be located at the bottom of cooking chamber 105 as well. Racks (not shown) in cooking chamber 105 can be used to place food items at various levels for cooking. A window 110 on door 104 allows the user to view cooking chamber 105 and, e.g., food items therein during a cooking operation.

Oven appliance 100 includes a user interface 102 having a display 103 positioned on a top panel 114 with a variety of controls 112. User interface 102 allows the user to select various options for the operation of oven appliance 100 including e.g., temperature, time, and/or various cooking and cleaning cycles. Operation of oven appliance 100 can be regulated by a controller 160 (FIG. 3) that is operatively coupled i.e., in communication with, user interface 102, heating element 130, and other components of oven appliance 100 as will be further described.

For example, in response to user manipulation of the user interface 102, controller 160 can operate heating element 130. Controller 160 can receive measurements from a temperature sensor (not shown) placed in cooking chamber 105 and e.g., provide a temperature indication to the user with display 103. Controller 160 can also be provided with other features as will be further described herein.

By way of example, controller 160 may include a memory and one or more processing devices such as microprocessors, CPUs or the like, such as general or special purpose microprocessors operable to execute programming instructions or micro-control code associated with operation of oven appliance 100. The memory may represent random access memory such as DRAM, or read only memory such as ROM or FLASH. In one embodiment, the processor executes programming instructions stored in memory. The memory may be a separate component from the processor or may be included onboard within the processor. Alternatively, controller 160 may be constructed without using a microprocessor, e.g., using a combination of discrete analog and/or digital logic circuitry (such as switches, amplifiers, integrators, comparators, flip-flops, AND gates, and the like) to perform control functionality instead of relying upon software.

Controller 160 may be positioned in a variety of locations throughout oven appliance 100. In the illustrated embodiment, controller 160 may be located under or next to the user interface 102 otherwise within top panel 114. In such an embodiment, input/output ("I/O") signals are routed between controller 160 and various operational components of oven appliance 100 such heating element 130, controls 112, display 103, sensor(s), alarms, and/or other components as may be provided. In one embodiment, the user interface 102 may represent a general purpose I/O ("GPIO") device or functional block.

Although shown with touch type controls 112, it should be understood that controls 112 and the configuration of oven appliance 100 shown in FIG. 1 is provided by way of example only. More specifically, user interface 102 may include various input components, such as one or more of a variety of electrical, mechanical or electro-mechanical input devices including rotary dials, push buttons, and touch pads. The user interface 102 may include other display components, such as a digital or analog display device designed to provide operational feedback to a user. The user interface 102 may be in communication with controller 160 via one or more signal lines or shared communication busses. Also, oven appliance 100 is shown as a wall oven but the present invention could also be used with other appliances such as e.g., a stand-alone oven appliance, an oven range appliance and other configurations as well.

During operation of oven appliance 100 in both cooking and cleaning cycles, the temperatures that are needed in cooking chamber 105 can be high. Insulation panels 124, 126, and 128 in the bottom, rear, and top of oven appliance 100 assist with reducing heat transfer from oven appliance 100 to e.g., surrounding cabinetry. Additionally, oven appliance 100 is provided with a ventilation system whereby ambient air is used to assist cooling oven appliance 100.

More specifically, oven appliance 100 includes air passageways 118, 120, and 122 located within the bottom, rear, and top of the cabinet 101 of oven appliance 100. A fan or air handler 140 located in cavity 132 pulls air into an inlet 138 of air handler 140. The air is forced through duct 136 and exits oven appliance 100 through vent 134 located between door 104 and top panel 114. Air handler 140 pulls air from the electronics bay (enclosure) 132, which is connected with air passageways 118, 120, 122. Cooler air, e.g., from the ambient atmosphere, is pulled into air passageway 118 through air inlet 108, which is located below door 104. The flow of air is indicated by arrows A in FIG. 2. The ventilation system described for oven appliance 100 is provided by way of example only. As will be understood by one of skill in the art using the teachings disclosed herein, numerous other configurations may be used as well. By way of example, the flow of air could be reversed by changing the direction of operation of air handler 140. Different arrangements of the air passageways 118, 120, 122 may also be used as well.

FIG. 4 provides a perspective view of air handler 140 according to an exemplary embodiment of the present subject matter. As may be seen in FIG. 4, air handler 140 includes a fan motor 142 and a shaft 144. Shaft 144 is mounted for rotating about an axis of rotation X. Motor 142 is selectively operable, e.g., by or with controller 160, to rotate shaft 144. Thus, shaft 144 is coupled to motor 142 such that shaft 144 rotates about the axis of rotation X during operation of motor 142. Air handler 140 also includes a housing 146. An impeller 148 is disposed or positioned within housing 146 (a portion of housing 146 is shown removed in FIG. 4 in order to show impeller 148 within housing 146). Impeller 148 is coupled (e.g., mounted to) shaft 144. Thus, impeller 148 rotates with shaft 144, e.g., about the axis of rotation X, during operation of motor 142 to urge the flow of air A (FIG. 2) through air passageways 118, 120, 122. In the exemplary embodiment shown in FIG. 4, impeller 148 has a "paddle wheel" or "squirrel cage" impeller arrangement. However, in alternative exemplary embodiments, impeller 148 may have any suitable arrangement, such as a "radial" blade arrangement.

At least one magnet 150 (e.g., one, two, three, four or more magnets) is mounted to shaft 144 of air handler 140. Thus, magnet 150 rotates with shaft 144 during operation of motor 142. In alternative exemplary embodiments, magnet 150 may be mounted to any other rotatable component of air handler 140. For example, magnet 150 may be mounted to impeller 148.

In the exemplary embodiment shown in FIG. 4, magnet 150 is mounted to shaft 144 of air handler 140 at a distal end 145 of shaft 144. In alternative exemplary embodiments, magnet 150 may be disposed between motor 142 and housing 146 on shaft 144. As an example, magnet 150 may be disposed between motor 142 and housing 146 on shaft 144 when air handler 140 is a dual impeller air handler and includes an additional housing and an additional impeller. Impeller 148 and the additional impeller may be positioned on opposite sides of shaft 144, e.g., such that impeller 148 and the additional impeller are positioned opposite each other about motor 142.

A magnetoresistive sensor 152 is positioned adjacent magnet 150. More specifically, magnetoresistive sensor 152 is placed near the magnet 150 positioned on shaft 144 and is within the magnetic field provided by magnet 150. Magnetoresistive sensor 152 may be mounted to motor 142 such that magnetoresistive sensor 152 is fixed relative to motor 142 during rotation of shaft 144 with motor 142. Controller 160 is in communication with magnetoresistive sensor 152 via a wiring harness 154. Thus, an output of magnetoresistive sensor 152 may be received by controller 160. By monitoring the output of magnetoresistive sensor 152, it can be established whether air handler 140 is operating properly and rotating impeller 148.

As an example, when air handler 140 is properly operating, motor 142 rotates shaft 144 and impeller 148 such that magnet 150 also rotates on shaft 144. The rotations of magnet 150 subject the magnetoresistive sensor 152 to a changing magnetic field that may generate a pulse train indicative of rotation of shaft 144 with motor 142. Additionally, the pulse train can also be used to determine the rate of rotation of impeller 148. Conversely, when air handler 140 is not properly operating, motor 142 may not rotate shaft 144 and impeller 148 (e.g., at a suitable speed) such that magnet 150 also does not rotate relative to magnetoresistive sensor 152. Thus, magnetoresistive sensor 152 may not be subjected to the changing magnetic field that may not generate the pulse train indicative of rotation of shaft 144 with motor 142.

A speed of impeller 148 may also be determined from the output of magnetoresistive sensor 152 during operation of air handler 140. For example, based upon a frequency that the output of magnetoresistive sensor 152 changes, the angular speed or RPMs of impeller 148 may be calculated, as will be understood by those skilled in the art. In particular, if the output of magnetoresistive sensor 152 changes twice during each complete rotation of shaft 144, the angular frequency of shaft 144 may be determined as the elapsed time between two changes the output of magnetoresistive sensor 152. By determining from the output of magnetoresistive sensor 152 the speed of rotation of impeller 148, controller 160 may determine whether the flow of air A through the air passageways 118, 120, 122 meets a level or amount that has been predetermined as sufficient for properly cooling of oven appliance 100.

In the event the measured air flow is sufficient, controller 160 may e.g., continue monitoring the air flow. Alternatively, if the measured air flow is not sufficient—i.e., does not meet or exceed the predetermined level—then controller 160 may take one or more remedial actions. For example, controller 160 may provide a visible and/or audible alarm to the user of oven appliance 100 or send a message to the user's home computer or cellular telephone. Alternatively, or in addition thereto, controller 160 may deactivate heating element 130 or reducing the heat output from heating element 130 to a level for which oven appliance 100 can operate safely.

FIG. 5 illustrates a method 500 for operating an oven appliance according to an exemplary embodiment of the present subject matter. Method 500 may be used to operate any suitable oven appliance. For example, method 500 may be used to operate oven appliance 100 (FIG. 1). Controller 160 (FIG. 3) may be programmed or configured to implement method 500.

At step 510, a heating operation (e.g., a cooking or cleaning operation) of oven appliance 100 is initiated. For example, a user of oven appliance 100 may utilize user interface 102 and controls 112 to signal controller 160 and initiate the heating operation at step 510. At step 520, controller 160 operates or activates heating element 130 during the heating operation. Thus, heating element 130 may heat cooking chamber 105 of cabinet 101 during the heating operation.

At step 530, air handler 140 is operated in order to circulate the flow of air A through air passageways 118, 120, 122 and cool oven appliance 100 during the heating operation, e.g., while heating element 130 is activated. As an example, controller 160 may activate motor 142 of air handler 140 in order to rotate impeller 148 and draw the flow of air A through air passageways 118, 120, 122 at step 530.

At step 540, controller 160 receives the output of magnetoresistive sensor 152 and determines whether magnetoresistive sensor 152 is triggered operation of air handler 140. Thus, controller 160 may establishing whether air handler 140 is operating or not operating based at least in part on the output of magnetoresistive sensor 152 at step 540. As an example, controller 160 may establish that air handler 140 is operating if the output of magnetoresistive sensor 152 changes during step 540. Thus, magnetoresistive sensor 152 is exposed to a changing magnetic field provided by magnet 150 and the output of magnetoresistive sensor 152 also changes if magnet 150 is rotating at step 540. As another example, controller 160 may establish that air handler 140 is not operating if the output of magnetoresistive sensor 152 does not change during step 540. Thus, magnetoresistive sensor 152 is exposed to a static magnetic field provided by magnet 150 and the output of magnetoresistive sensor 152 does not change if magnet 150 is not rotating at step 540.

If air handler 140 is operating properly at step 540, the heating operation may be continued, e.g., until the food items are cooked or a user terminates the heating operation. Conversely, heating element 130 is deactivated or the power output of heating element 130 is, e.g., at least partially, reduced if air handler 140 is not operating at step 540. Thus, if air handler 140 is not operating properly and drawing the flow of air A through air passageways 118, 120, 122 during the heating cycle, controller 160 deactivates heating element 130 to prevent or reduce further heating of oven appliance 100 with heating element 130.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An appliance, comprising:
   a cabinet defining an air passage, the air passage configured for directing air through at least part of the cabinet;
   an air handler positioned proximate the air passage, the air handler including a motor, a shaft and an impeller, the impeller coupled to the shaft, the shaft selectively rotatable with the motor such that the impeller selectively urges a flow of air through the air passage;
   a housing, the impeller disposed within the housing;
   a magnet mounted to the shaft of the air handler, the magnet disposed between the motor and the housing on the shaft of the air handler; and
   a magnetoresistive sensor positioned adjacent the magnet.

2. The appliance of claim 1, further comprising a controller in communication with the magnetoresistive sensor, the controller configured for monitoring an output of the magnetoresistive sensor, the output of the magnetoresistive sensor changing when the motor rotates the shaft.

3. The appliance of claim 2, further comprising a heating element positioned adjacent a cooking chamber of the cabinet, the controller configured for deactivating the heating element if the output of the magnetoresistive sensor does not change during a heating operation of the appliance.

4. The appliance of claim 1, Wherein the air handler further comprises an additional impeller coupled to the shaft, the impeller and the additional impeller positioned opposite each other about the motor.

5. The appliance of claim 1, wherein the magnetoresistive sensor is mounted to the motor such that the magnetoresistive sensor is fixed relative to the motor during rotation of the shaft with the motor.

6. A method for operating an appliance, comprising:
   initiating a heating operation of the appliance;
   activating an air handler of the appliance during the heating operation in order to draw a flow of air through an air passage of the appliance;
   receiving an output of a magnetoresistive sensor of the appliance during said step of activating, the magnetoresistive sensor positioned adjacent a magnet on a shaft, the magnet disposed between a motor and a housing on the shaft; and
   establishing whether the air handler is operating or not operating based at least in part on the output of the magnetoresistive sensor during said step of receiving.

7. The method of claim 6, further comprising operating a heating element of the appliance during the heating operation.

8. The method of claim 7, further comprising deactivating the heating element if the air handler is not operating at said step of establishing.

9. The method of claim 6, Wherein said step of establishing comprises:
   establishing that the air handler is operating if the output of the magnetoresistive sensor changes during said step of receiving; and
   establishing that the air handler is not operating if the output of the magnetoresistive sensor does not change during said step of receiving.

10. An appliance, comprising:
    a cabinet defining an air passage, the air passage configured for circulating air therethrough;
    an air handler having an impeller, a motor, a shaft and a housing, the impeller positioned proximate the air passage, the impeller coupled to motor with the shaft, the motor being operable to rotate the shaft, the impeller disposed within the housing; and
    means for determining whether the impeller is rotating, wherein the means for determining comprises a magnet and a magnetoresistive sensor, the magnet disposed between the motor and the housing on the shaft, the magnetoresistive sensor positioned adjacent the magnet.

11. The appliance of claim 10, wherein the magnetoresistive sensor is mounted to the motor such that the magnetoresistive sensor is fixed relative to the motor during rotation of the shaft with the motor.

* * * * *